United States Patent [19]

Hargreaves

[11] 4,038,201

[45] July 26, 1977

[54] POLYCRYSTALLINE BODIES AND MEANS FOR PRODUCING THEM

[75] Inventor: Walter A. Hargreaves, West Brookfield, Mass.

[73] Assignee: Optovac, Inc., North Brookfield, Mass.

[21] Appl. No.: 237,706

[22] Filed: Mar. 24, 1972

[51] Int. Cl.$^2$ .................. F21V 9/00; G02B 5/20; G02C 7/10
[52] U.S. Cl. .................. 252/300; 23/273 R; 423/490
[58] Field of Search .................. 252/300; 423/490

[56] References Cited

U.S. PATENT DOCUMENTS 3,453,215   7/1969   Carroll, Jr. et al. .................. 423/490

OTHER PUBLICATIONS

*Kodak Istran Infrared Materials,* Kodak Publication U-72 (1971), pp. 7-10.

*Primary Examiner*—Jack P. Brammer
*Attorney, Agent, or Firm*—Watson, Leavenworth, Kelton & Taggart

[57] ABSTRACT

Polycrystalline optical materials formed from halides of alkali and alkaline-earth metals and of other metals, and mixtures thereof, some of which contain selected additives to act as nucleators and grain-growth regulators, and also apparatus and method of producing these materials from a liquid melt are disclosed. The polycrystalline products have optical transmissions approaching those of single-crystal materials, but exhibit significantly higher resistance to thermal and mechanical shock. The disclosed method and apparatus allows formation of unshattered polycrystalline ingots of any desired size by uniform nucleation from a homogeneous melt, and involves the controlled uniform removal of heat from the solidifying mass alone or in combination with a continuous addition-solidification process, which results in the formation of a substantially clear polycrystalline body or ingot, free of voids, and composed of randomly oriented single crystal having grain growths in a range of from about 0.01 to 10 mm. cross dimension.

17 Claims, 19 Drawing Figures

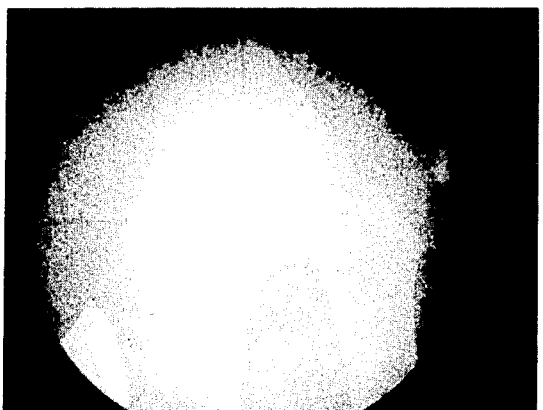

FIG. 15    X 32

Reflection micrograph of fine ground polynucleated $CaF_2$ without additives

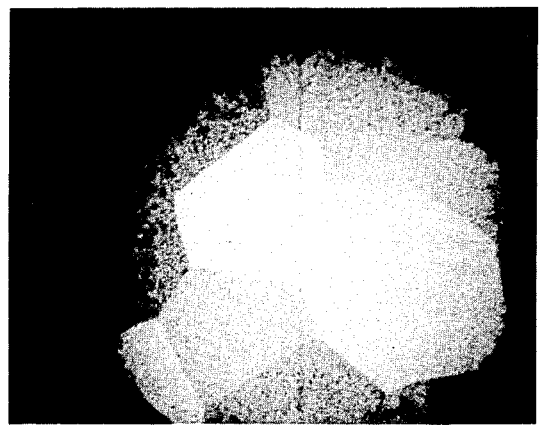

FIG. 16    X 32

Reflection micrograph of fine ground polynucleated $BaF_2$ without additives

All micrographs taken in a 8 mm field of view (32 X).

FIG. 17

Polarization micrograph of polished $CaF_2$ : 50% $YF_3$ polynucleated crystal

FIG. 18

Polarization micrograph of polished $BaF_2$ : 2% $LaF_3$ polynucleated crystal

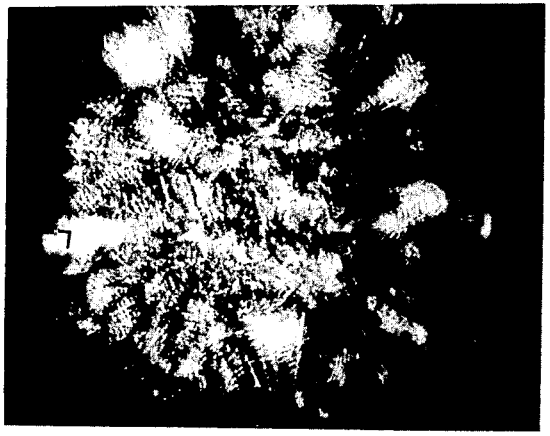

X 32

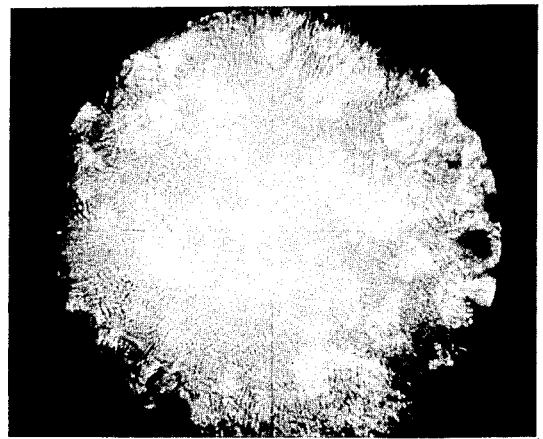

X 32

POLYCRYSTALLINE BODIES AND MEANS FOR PRODUCING THEM

BACKGROUND OF THE INVENTION

Field of Invention

Single crystals having desirable optical transmission in spectral regions ranging from the ultraviolet, through the visible, and into wavelengths beyond 10 microns in the infrared are widely used in various scientific optical instruments. Good quality single crystals of calcium fluoride and barium fluoride, for example, have the ultimate possible optical characteristics for their particular compositions. In general, where the ultimate in optical performance is required, the single-crystal materials are selected.

There are, however, many applications where factors such as cost, thermal or mechanical shock considerations, required physical properties such as hardness, toughness, etc., or other such considerations, dictate the use of a polycrystalline optical material. Another important consideration is that polycrystalline materials can be made much more economically in larger sizes than those available from single crystal techniques.

Various procedures for the manufacture of polycrystalline optical material are known. One method involves the hot pressing of a powder, as taught by the Carnall U.S. Pat. Nos. 3,476,690 and 3,206,297. Another involved the high temperature sintering of cold pressed materials, as taught by the St. Pierre et al U.S. Pat. No. 3,026,177.

Successful production of various optical materials has been achieved by employing these powder pressing techniques, but optical performance has been limited by certain processing shortcomings, e.g., by impurities in grain boundaries, which cause light scattering and absorption. This has been especially true as element size is increased, e.g., polycrystalline materials of six inches in diameter or more. Generally, such pressed materials show considerably poorer optical performance than the single crystal material of the same composition. Often the optical transmission is highly variable over various regions of the optical spectrum, and this is related to the particle size of the individual grains forming the material.

In addition to the above considerations, powder pressing methods require elaborate and expensive pressure generating equipment operating in the pressure range 4000 to 50,000 psi and at temperatures up to 1500° C. Optical materials as large as eight inches in diameter and two inches thick have been pressed in such equipment, but various physical problems and also equipment costs limit the production of large size units. In present scientific applications durable large size optical materials are urgently required for missile, satellite, and other devices. Good optical quality laser windows free of critical energy absorptions are required in diameters of 12 inches and even much larger, and they must withstand the thermal and mechanical shocks involved in aircraft and other such usage.

The production of polycrystalline optical materials from a homogeneous melt is an alternative solution to powder pressing. The Bridgman U.S. Pat. No. 1,793,672 discloses techniques and apparatus primarily suited for the growth and purification of single crystals, but also teaches that a multicrystalline solid can be obtained by rapidly lowering a mold out of the melting zone of a crystallizing furnace. However, there are several important physical reasons why the Bridgman technique has not been found useful for formation of certain metal halide polycrystalline optical elements. Such metal halides are all ionic crystals and decrease strongly in volume in converting from liquid to solid form. They therefore readily form voids and dendritic structures within the solid body which destroy the optical usefulness of the product. Another important factor is that the ionic crystals form by nature a fairly rigid atomic structure at temperatures fairly close to their melting points. They do exhibit limited flow characteristics at temperatures considerably below the melting point, but never to the extent that would allow adequate volume compensation for the volume changes of about ten to twenty percent which occur in the freezing or solidification of same from the molten state.

It is known that certain materials readily can be formed in the polycrystalline condition without serious problems involving volume changes occurring during the freezing process. An example is polycrystalline germanium, which is available as a good large size element of reasonable optical quality. Germanium is one of the less common materials which has a higher specific volume in the solid form over that of the liquid form and for that reason a void problem as can occur with certain metal halides is not encountered. Other examples of successful polycrystalline materials are the common metals and alloys, and some of the IV-VI and V-VI compounds of the periodic system. Even where there is the usual volume decrease in the freezing or solidification process, factors such as non-ionic binding, high density, wide temperature ranges of low-viscosity regions considerably below the melting points, and other considerations, all or severally tend to allow the attainment of good polycrystallinity. Such favorable factors are not present for the case of the polycrystalline metal halides as has been discussed previously.

SUMMARY OF THE INVENTION

The present invention relates to the making of optical quality polycrystalline materials of all sizes by uniform nucleation from melts of ionic materials such as the metal halides. Obtainment of such products has not been possible previously because of problems involving voids and dendritic formations which have made them of little usefulness for optical purposes. The products of the present invention include polycrystalline materials of the periodic table group IIA metals and a halide of group VIIA, the halides of the latter group being the ordinary halides, including fluorine, chlorine, bromine and iodine. Calcium flurodide and polycrystalline barium fluoride, materials with and without special grain-growthy-controlling and nucleating additives are particularly useful for providing polycrystalline materials in accordance with the present invention.

An object of this invention is to provide relatively inexpensive apparatus capable of producing, from a homogeneous melt, optical quality polycrystalline materials of any size having controlled grain growth size in a predetermined range.

Another object of this invention is to provide new materials calcium fluoride and barium fluoride that are polycrystalline in physical composition, yet have optical properties similar to the respective single-crystal substances.

Another object of this invention is to provide a new polycrystalline substance of barium fluoride and lanthanum fluoride possessing useful optical properties.

Another object of this invention is to provide a new polycrystalline substance of calcium fluoride and yttrium fluoride possessing useful optical properties.

Another object of this invention is to provide a basis for the selection of materials which act as nucleating agents and grain-growth controllers or regulators for substances being polycrystallized.

Other objects of this invention will, in part, be obvious and will, in part, appear hereinafter.

The production of polycrystalline materials in accordance with the present invention involves heating a batch of crystallizable material to molten state and thereafter subjecting the mass to cooling at substantially the polynucleation temperature thereof by removing heat in predetermined directions of outflow at a rate which is substantially equal in each direction of outflow. Such cooling thereby initiates freezing of the mass as a plurality of individual crystals each of which cohere with others in random orientation and induces substantially uniform contraction of the frozen material in directions in correspondence to the heat outflow with such heat removal being effected at a controlled rate to maintain sufficient of said batch of material molten to flow into and fill any voids which may be produced in the already frozen portion by contraction, the heat removal further being effected through the frozen portion at a rate which is at least substantially equal to the rate of liberation of latent heat of fusion and specific heat from the remaining molten material as the latter freezes. The heat removal is then continued at the rate aforesaid until the mass is completely frozen into a solid polycrystalline ingot. In accordance with the invention, freezing can be effected with heat removal outflow occurring in plural directions of outflow from the mass or in a single or linear outflow alone.

Production of the ingot can be effected either wholly in a single vessel, or the material can be melted first in one vessel and then transferred to a second vessel for effecting polynucleation. In the former instance, the cooling of the material and contraction consequent therewith is compensated for by the flowing of molten material from the remainder of the molten mas into any voids present in an already frozen portion. In the latter instance, the molten material is frozen in the second vessel, with transfer of molten material from the first to second vessel occurring at a rate which provides continuing presence of sufficient molten material in the latter to fill voids in any mass already frozen in the second vessel and before molten material added to the second vessel freezes.

In one form, the apparatus provided by the present invention includes a furnace having two separate furnace zones along with furnace baffling and heating means associated with such furnace zones. Disposed within the furnace is an elongated crucible comprised of a material inert to the substance to be polycrystallized and having two compartments therein, an upper compartment in which the substance to be polycrystallized is melted, and a lower compartment for polynucleating the material with a passage interconnecting the compartments to permit transfer of the molten material from the first to second compartment. In operation of such apparatus, the material to be polycrystallized is placed in the upper compartment of the crucible and optionally a plug of either consumable (e.g., of the material being polycrystallized) or non-consumable composition is placed over the passage to prevent small particles of the material from passing from the upper to the lower compartment of the crucible prior to melting the material in the first. In one embodiment of the invention the furnace is suitably enclosed from the atmosphere to allow polynucleation to result from a melt prepared and purified under selected environmental conditions, for example, under a condition of vacuum, in a pure inert gas environment, in a pure halogen or halide gas environment, or in a mixed inert gas and halogen or halide gas environment. The melting phase is effected by supplying heat to melt the material in the upper crucible compartment, while heat concurrently is supplied to the lower crucible compartment until substantially the polynucleation temperature of the material to be polycrystallized is attained in such second compartment. The polynucleation temperature range of a substance is intended to mean herein a temperature range below the melting point of the material at which a rapid uniform removal of heat results in the formation of numerous nucleation or independent crystallization centers which form without substantial growth at the expense of other crystals. For the purpose at hand this is a rather limited temperature range with the upper temperature limit thereof being determined by the formation of nucleation centers which grow rapidly to undesired large grain sizes, whereby the large grains gradually eliminate smaller ones, and with the lower limit determined by the temperature at which the material freezes so fast that molten material will not flow and fill any voids in already frozen material and uniform heat loss through the polycrystallizing body is not possible, so that uniform formation is no longer controllable, as required for the production of good quality material.

To enhance further the polynucleation process by attaining smaller grain sizes, greater physical strength of the optical material, and a broader temperature range at which polynucleation may occur, it has been found that additive materials or grain-growth regulators may be used. The proper selection of the grain-growth regulators or dopants for a material to be polycrystallized is based upon certain factors of varying importance, such as chemical and physical compatibility, the known or expected optical transmission characteristics of the pure additives, heats of crystallization or phase change of the additives compared to the main component, and the relationship of ion sizes among the additive and additives with the main component. The effect produced by any one of these factors on the material to be polycrystallized may, of course, be modified or altered by the interrelationship of all the other factors. Selection of grain-growth regulators for the polycrystallization of any of the metal halides, or mixtures thereof, can be made utilizing the above factors, with good results being obtained with the selection of lanthanum fluoride as an additive for barium fluoride and yttrium fluoride as an additive for calcium fluoride.

Near the completion of the melting of the material to be polycrystallized, either with or without dopants, the molten material in the upper zone of the furnace melts the plug, or the plug is removed between the two compartments and the molten material flows from the first compartment to the second compartment as freezing is initiated, the transfer of the material being accomplished to insure presence of molten material in the second compartment to fill voids produced in an already frozen portion by contraction and at such rate that the latent heat of fusion and specific heat liberated by the added material is substantially equal to the uniform removal of heat through the already frozen material and out through the crucible structure. The lower compartment of the crucible is constructed and the furnace zones baffled in such a manner as to allow for a rapid and uniform removal of heat from the material therein in a predetermined direction, e.g., down through the material being polycrystallized and out through the bottom of the crucible. The lower compartment of the crucible is set and maintained at a temperature in the polynucleation range, so that polycrystallization proceeds as the molten material from the upper compartment adds to the solid body already formed with desired grain size and grain growth. Under the controlled conditions and by removing heat in predetermined directions at uniform rates from the material in the crucible, contraction of the same when freezing is likewise controlled and uniform in correspondence to the direction of heat removal and voids and dendrites in previously solidified or frozen material are filled by the newly added low viscosity addition in a uniform and continuous manner. The polycrystalline materials thereby produced have grain growth sizes in the range of 0.01 to 10 mm. in cross dimension, with the grain boundaries in intimate contact with one another as a consequence of being grown from a liquid melt.

The construction of the apparatus and method employed allows for modification in such a manner as to allow a continuous addition of feed of material under vacuum, or controlled atmospheres, to be melted in the first compartment of the crucible by procedures of known manner, so that polycrystalline materials of any desirable size may be produced. Control over the grain growth size can be effected by the addition of dopants as hereinbefore discussed, along with other factors such as passage size, temperature of the first compartment relative to the second compartment, and superheating or supercooling of the material to be polycrystallized.

BRIEF DESCRIPTION OF THE DRAWINGS

Further understanding of the present invention will be had from the detailed description to be given when taken in conjunction with the accompanying drawings, in which:

FIGS. 15 and 16 are reflection photomicrographs, taken in polarized light, or polycrystalline calcium fluoride and polycrystalline barium fluoride, respectively, showing characteristic grain growths of two compositions which embody the invention;

FIGS. 17 and 18 are photomicrographs, taken in polarized light, of polycrystalline calcium fluoride doped with yttrium fluoride and polycrystalline barium fluoride doped with lanthanum fluoride, respectively, illustrating the characteristic grain growths of these two compositions

DESCRIPTION OF THE PREFERRED EMBODIMENTS

The apparatus and technique disclosed in this invention is suitable for growing polycrystalline materials of any desired size and shape at low cost from a homogenous melt that includes such materials as alkali metal halides, alkaline earth metal halides, other metal halides, and mixtures thereof which were previously impossible to grow from a molten mass due to uneven heat flow losses from masses of molten material, preferential grain growth, volume changes upon solidification, and the physical properties of the materials.

While the present invention will be described, by way of example and for convenience, in respect of the growing of polycrystalline barium fluoride doped with lanthanum fluoride and of calcium fluoride doped with yttrium fluoride, it will be understood that the invention has a wide range of applicability to other types of polycrystalline materials especially mixtures of group IIA metals and the ordinary halides of group VIIA halides.

Figure 1:
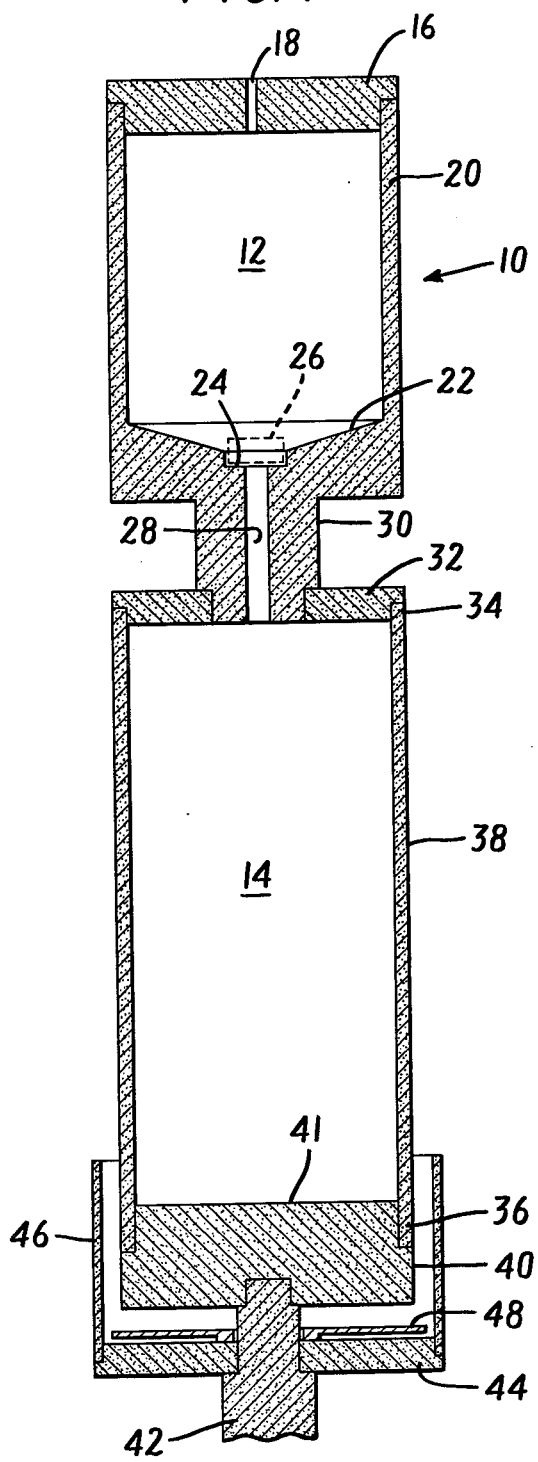
FIG. 1 is an elevational view in section of an elongated crucible provided by the present invention and having an upper melting compartment, a lower polynucleation compartment, and a passage connecting the two compartments for transferring the molten material from the former to the latter once it is above the melting point of the material.

With reference now to FIG. 1, there is shown an important component of apparatus provided by the present invention, i.e., an elongated crucible 10 which is comprised of two hollow cylindrical compartments, an upper compartment 12 into which the substance to be polycrystallized is placed, and a lower compartment 14 that serves as a polynucleation compartment for rapidly and uniformly conducting heat from the material received therein in the manner as will appear later. The top of compartment 12 is covered with a graphite plate 16 having a venting passage 18 therein, with the plate 16 being constructed to fit firmly and closely over the encircling wall 20 of the crucible which defines the compartment 12. The lower section of compartment 12 is enclosed by structure including an inwardly and downwardly sloping conical surface 22 which terminates in a centrally disposed stepped down flat segment 24 providing space for receiving, before the material to be polycrystallized is placed in compartment 12, a plug 26 for selectively blocking passage 28 interconnecting compartments 12 and 14 in crucible 10. Plug 26 conveniently is comprised of a block of the crystalline material to be polycrystallized, but it is also possible for the plug to be made of any suitable consumable or non-consumable material. The flat indented or stepped down surface 24 terminates as indicated above in passage 28 which connects the upper compartment 12 with the lower compartment 14, the passage 28 being encircled by a relatively thicker, necked in stub continuation 30 of the cylindrical wall structure 20. The size of passage 28 (as well as the number of same) and the length of stub 30 are interdependent variables that may be modified in reference to the viscosity of the material to be polycrystallized as well as superheating or supercooling of such material and the effect the latter would have on any already polycrystallized material present in compartment 14. Bore sizes of passage 28 from about 0.01 to about 0.5 inches in diameter and lengths of 0 to 5 inches long can be used for different materials. In polycrystallizing barium fluoride doped with lanthanum fluoride, a single passage 28 of circular configuration and about 0.128 of an inch diameter and a passage length of about 1 inch provides good results when the material in the upper compartment 12 is heated slightly above the melting point of the mixture, to about 1350° C., and the lower compartment 14 is maintained at the nucleation temperature of the material at about 900° C.

The lower crucible compartment 14 is comprised by a hollow cylindrical member of encircling wall 38 having opposite ends 34 and 36, the upper end 34 being formed to engage tightly with an upper portion of hollow cylindrical plate 32 as shown, while the lower end 36 fits tightly around the bottom plate 40 of the crucible. The bottom plate 40 has a flat upper surface 41 to provide a broad area from which heat can be rapidly and uniformly removed while the size of passage 28 has been constructed to add molten material at a rate sufficient to fill voids created by volume shrinkage in freezing, but slow enough as not to interfere with polycrystallization. Crucible 10 is received on an upright graphite member 42 which in turn supports a platform 44 carrying a cylindrical graphite element 46, and molybdenum baffle disc 48 which components function to further facilitate uniform removal of heat from the bottom portion of compartment 14 and thereby aid in the controlled formation of polycrystalline material with small grain growths.

All of the components depicted in FIG. 1, except plug 26 and baffle 48 are made of commercially available, high purity AUC graphite manufactured by Carbon Products Division, Union Carbide Corp., Chicago, Ill.

Figure 6:
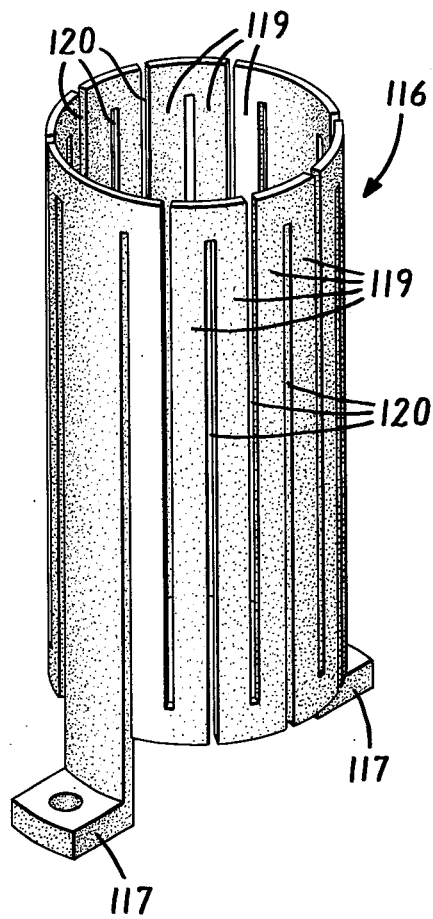
FIG. 6 is a perspective view of a graphite heating element which can be employed in the furnaces depicted in FIGS. 2 and 3.
Figure 2:
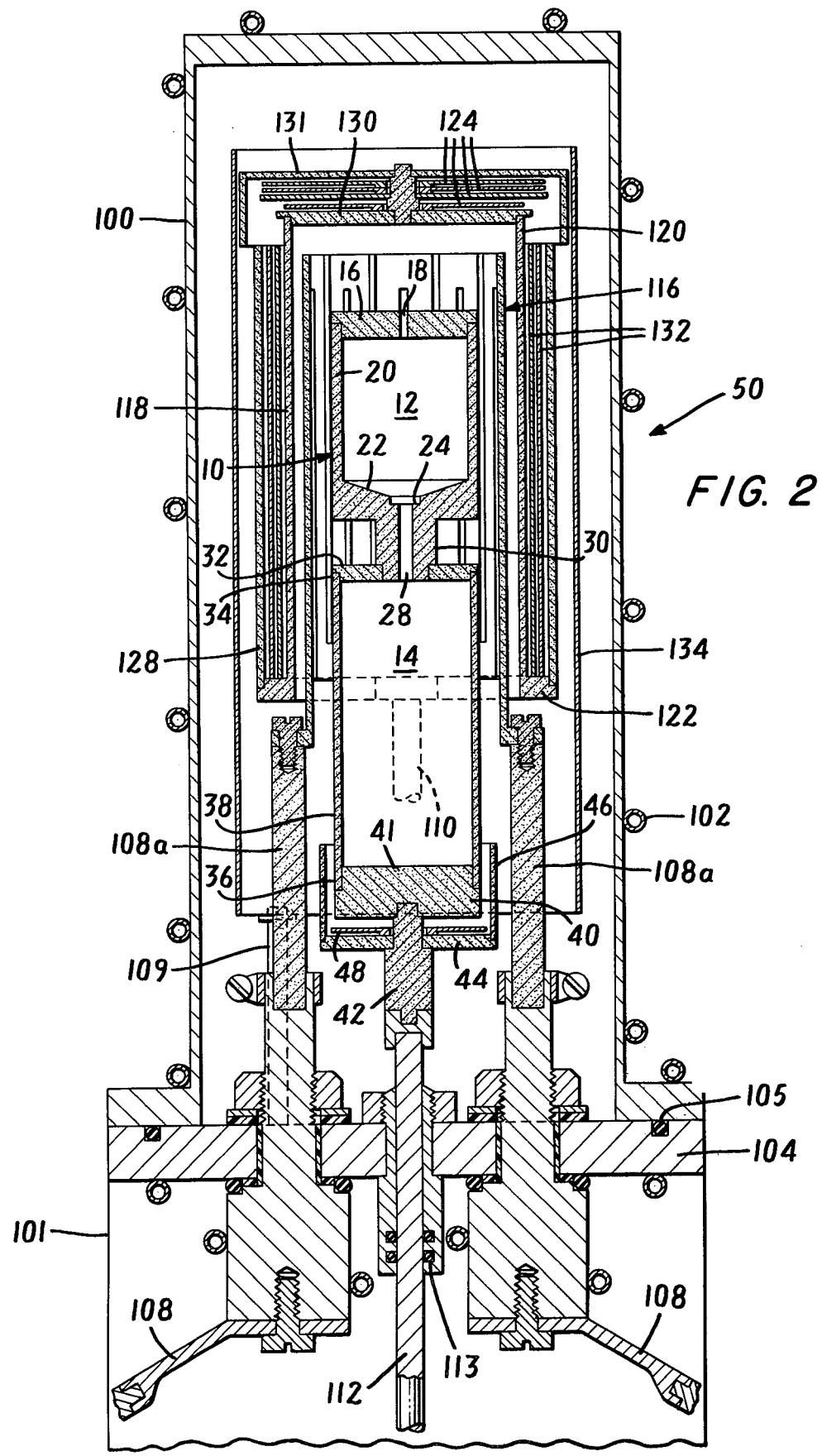
FIG. 2 is an elevational view in section, of one form of baffled furnace provided by the present invention showing the relative positioning therein of the elongated crucible, heating elements, baffling and outer wall structure.
Figure 4:
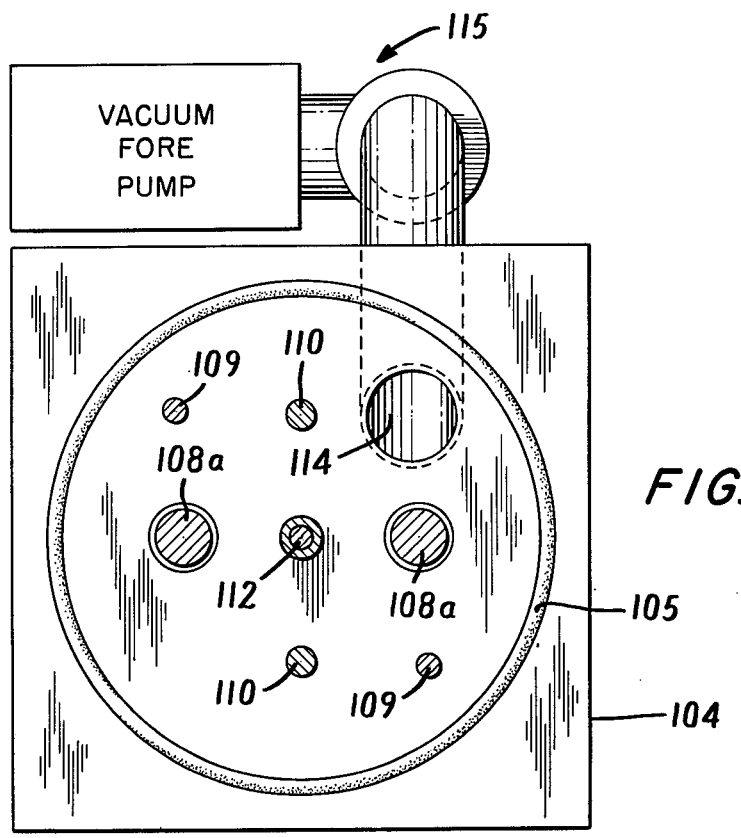
FIGS. 4 and 5 are plan views partly in section of the base structure of the furnaces depicted in FIGS. 2 and 3, respectively, illustrating the number and positioning of electrodes, support bars, and crucible carrier rods.

Furnaces which can be used for polycrystallizing materials may be of various types of construction such as induction type, electric resistance type, or any other furnace suited to attain the temperature required. One type of furnace which can be used for growing polycrystalline barium fluoride doped with lanthanum fluoride is a baffled electric resistance type furnace 50 of the construction shown in FIG. 2. Referring now to FIG. 2, the furnace 50 comprises an encircling outside wall structure 100 which is cooled by water flowing through cooling coils 102, the wall structure enclosing a space which, inter alia, serves to receive crucible 10. The furnace is mounted on a support unit 101 which includes a base plate 104 on which in turn the furnace stands and is in sealed joinder with the latter, the seal between the two being provided with an O-ring 105 with support unit 101 additionally containing electrical terminals 108, support rods 110, which serve to support certain baffling in the furnace and to be described shortly, and support rod 112 connected to upright member 42, an O-ring seal 113 being provided to prevent vapor communication between the furnace and support unit interiors along the surface of rod 112. Support 101 further contains an evacuation passage 114 connected to a diffusion pump and vacuum fore pump unit 115 (FIG. 4). The electrical terminals 108 include vertical extensions 108a extending upwardly into furnace 100 and which supportingly receive a graphite heating element 116, which as best seen in FIG. 6, comprises a hollow cylindrical graphite heating element 116 formed of a plurality of circularly spaced segments 119 arranged such that the slots 120 between alternate ones of said segments communicate alternately with opposite ends of the cylindrical body. The heating element 116 further is constructed so that a pair of segments 119 disposed at diametrical locations terminate at the lower end in terminal extensions 117 which are connected to vertical extensions 108a of terminals 108 thereby to support the cylinder 116 in a position within furnace 100 wherein it completely encircles the upper compartment 12 of crucible 10 and the upper half of compartment 14. Disposed at substantially 90 degrees to the electrical terminals 108 and extentions 108a thereof, are support rods 110 (FIG. 4) and disposed at an intermediate location between rods 110 and terminal extensions 108a are another set of support rods 109, the former support rods serving to hold side radiation baffles 132, graphite support cylinder 188, top baffles 124 and a top graphite assembly cover 130, with the support rods 109 holding the outer molybdenum baffles 134 that encircle the elongated crucible 10 within furnace 100. Graphite support cylinder 118 has ends 120 and 122 of which end 120 receives graphite top cover 130 which in turn holds the four molybdenum baffles 124 and a graphite top cover 131 in place. End 122 is constructed to receive a cylindrical graphite sleeve 128 which serves to hold the two inscribed molybdenum baffles 132 in place. The arrangement of graphite and molybdenum baffles at the top and sides of the furnace, including large outer molybdenum baffle 134, serves to reflect heat downward and to prevent heat losses from the sides, thereby allowing heat to be rapidly but uniformly removed unidirectionally from one end of the mass to be polycrystallized to the other.

In using furnace 100, the material to be polycrystallized is placed in the upper compartment of crucible 10 with a plug 26 being first provided to block passage 28. Outer wall 100 is fitted into place on the furnace to isolate the material from the atmosphere, and a vacuum of about $1 \times 10^{-6}$ Torr is obtained in the furnace. Such vacuum is advantageous for improving the purity of many materials to be polynucleated, but it is not essential since other pressures and atmospheric conditions may be used, such as inert gases, halogen or halide gases, or mixtures thereof. As can be seen in FIG. 2, the upper compartment 12 of crucible 10 normally is positioned in the more heated zone of furnace 50 being wholly inside heating element 116, whereas the lower compartment 14 is located partly outside and partly within the heating element 116 and accordingly is disposed in a cooler zone of the furnace, while being enclosed with baffling to minimize side heat losses and directing heat losses in a downward direction thereby to control removal of heat in predetermined directions from the material transferred into lower compartment 14.

Figure 9:
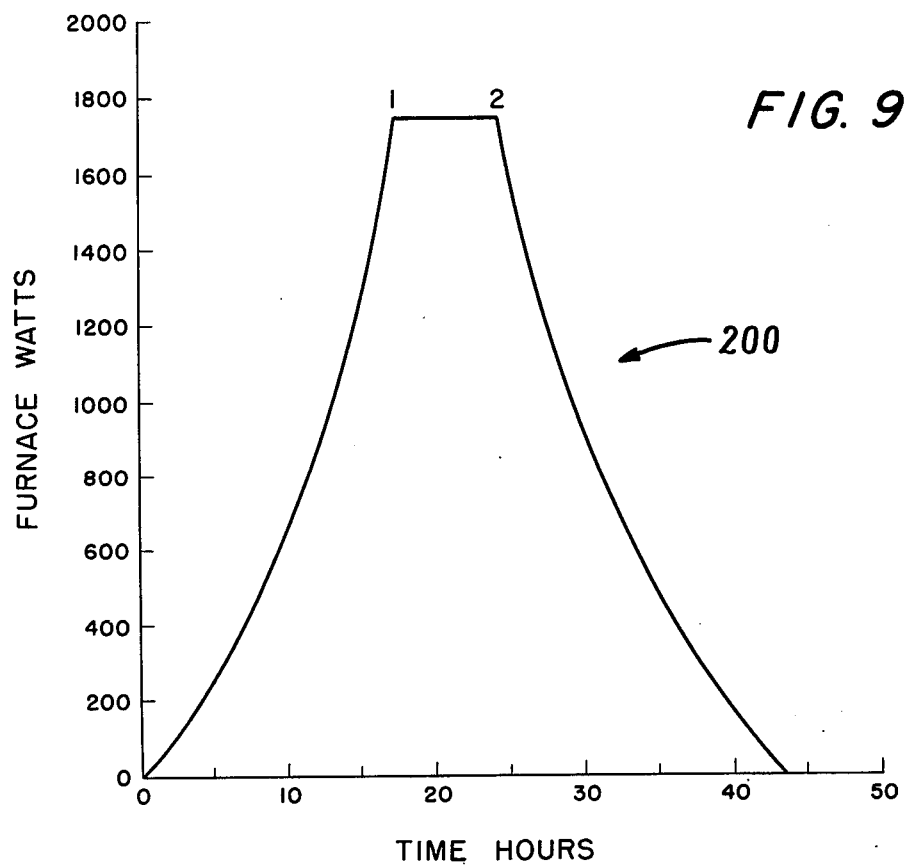
FIG. 9 is a graph showing the heating, melting, and cooling schedule of a polycrystal run involved in producing a polycrystalline ingot from a mixture of barium fluoride, 2% lanthanum fluoride in the furnace depicted in FIG. 2.
Figure 10:
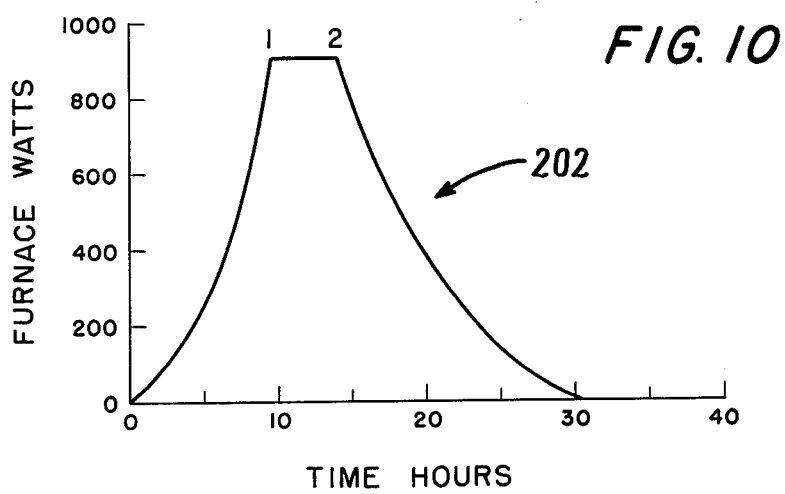
FIG. 10 shows the annealing schedule associated with the removal of strain from the polycrystal ingot produced in the run associated with FIG. 9. In such annealing, the cooled solid polycrystal was removed from the lower compartment to the upper compartment of the crucible, which in turn was placed in the vertical center of the heating unit so as to insure uniform heating and cooling.

In operation of the FIG. 2 apparatus to produce polycrystalline materials, a slow initial heating of the material in compartment 12 is preferable so as to drive off residual oxygen and water vapor present in the material as well as any present in the furnace parts. FIG. 9 shows a power input wattage versus time schedule for the polycrystallization of barium fluoride doped with lanthanum fluoride in the furnace of FIG. 2, and will be discussed in detail later in the description. In the furnace 100 of FIG. 2 the various elements, i.e., the heating element, baffling 124, 132, and positioning of the crucible 10 are arranged such that the polynucleation temperature level of the material is reached in crucible compartment 14, principally in the region of the upper surface 41 of plate member 40 at a time in the power versus time schedule of FIG. 9 near the end of the upper horizontal flat peak segment plateau in the curve. At this time the conditions are such that the material in the crucible upper compartment 12, which has gradually melted from the top downwards, becomes fully molten, including the crystal plug 26 if the latter is the same material as the crystalline material batch. Controlled transfer of the molten material in compartment 12 then takes place through passage 28, into lower compartment 14. Polycrystallization proceeds, starting with material depositing on surface 41 being cooled by controlled removal of heat therefrom substantialy only in a downward direction through plate 40 to initiate freezing of said deposited material as a plurality of individual crystals, each of which cohere with others in random crystal orientation and accompanied by substantially uniform contraction in the frozen material in a direction in correspondence to the direction of heat outflow. Heat outflow conditions are effected at a controlled rate to maintain sufficient of the additional molten material entering compartment 14 from compartment 12 and depositing on already frozen material, molten to enable same to flow into any voids produced in the already frozen portion by contraction of the same and at a rate which is at least substantially equal to the rate of liberation of latent heat of fusion and specific heat from the remaining molten material as the latter freezes thereby to preclude precipitous remelting and possible grain growth of already frozen material. This process continues in repetitive manner until the entire transferred molten batch becomes frozen in a single ingot mass in compartment 14, producing a uniformly formed polycrystalline body. The entire process of formation (polynucleation of the molten homogenous mass to a polycrystalline ingot) of an optical body in the furnace 100 of FIG. 2 occurs in the period while the power is substantially at the upper melting plateau or straight line part of the FIG. 9 curve. Following polynucleation the power is slowly lowered, as shown in the curve of FIG. 9. This slow cooling is sufficient to prevent breakage of the polycrystalline body, but is not sufficient to adequately anneal it. Annealing is a process of removing residual strains remaining in the material from the stresses introduced by thermal contractions caused by fast and uneven cooling. With the apparatus of FIG. 2, annealing is accomplished by opening the furnace 100 system after complete cooling, moving the polycrystallized body from the lower compartment 14 of crucible 10 to the upper compartment 12, re-establishing of vacuum conditions in the furnace chamber, and proceeding with an annealing cycle with the polycrystallized body positioned in an environment of substantially uniform thermal conditions near the center of heater 116, the annealing being effected in accordance with a power input wattage versus time schedule as shown in FIG. 10. A more advantageous annealing procedure attends use of the apparatus embodiment 60 shown in FIG. 3 in that annealing can be accomplished in situ and without cooling the body to room temperature.

Figure 3:
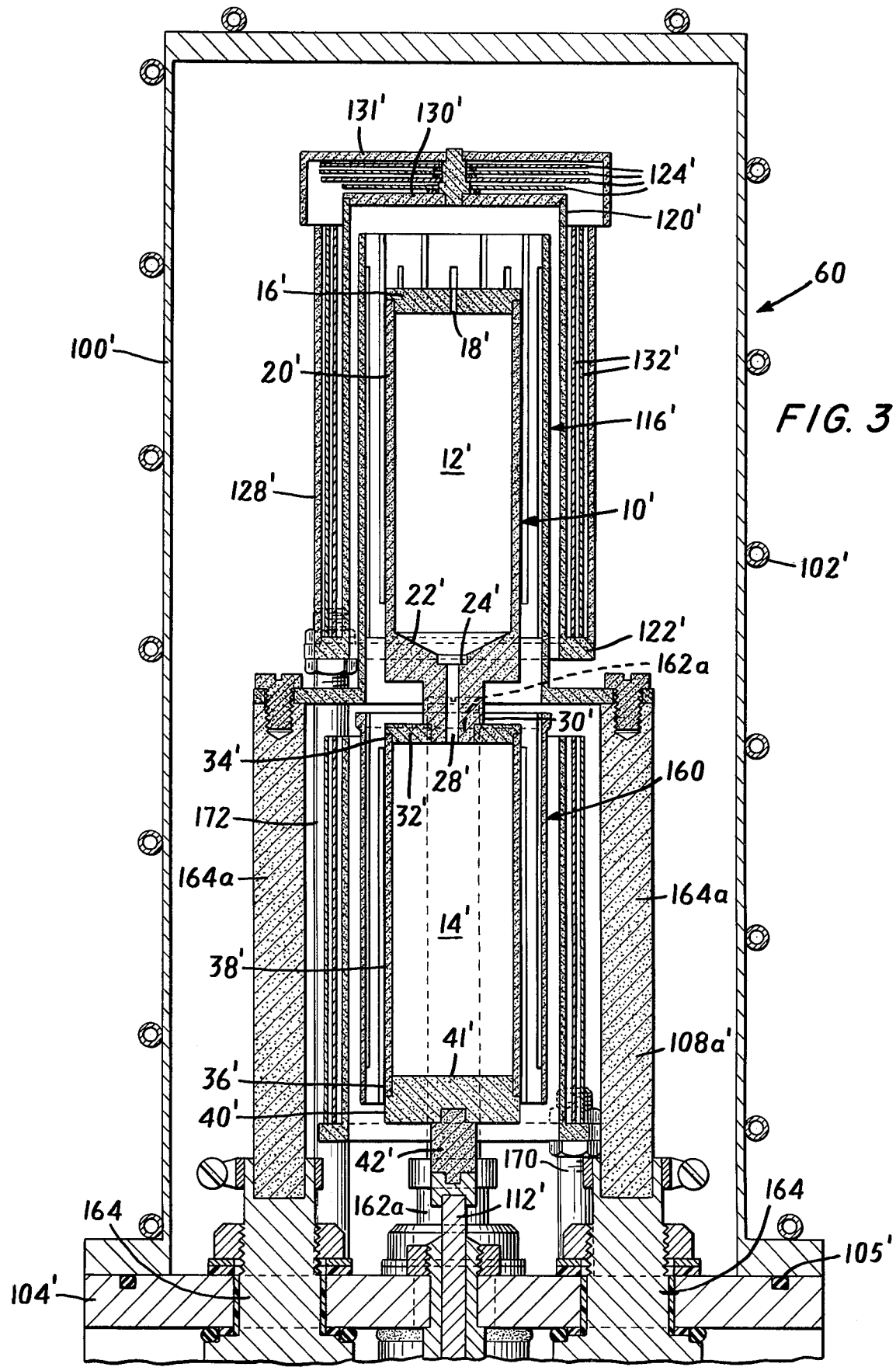
FIG. 3 is an elevational view in section depicting another embodiment of a baffled furnace embodying two zones with separate heating means, and containing therein an elongated crucible having two compartments with a passage interconnecting the compartments.
Figure 5:
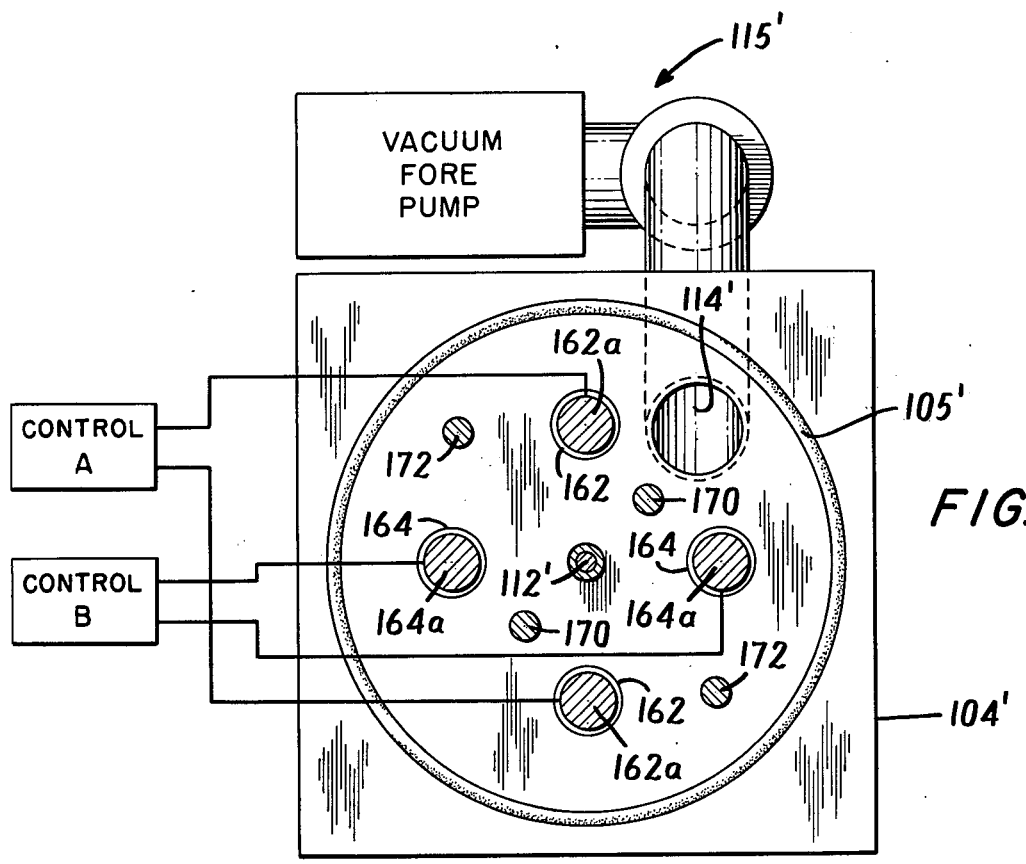

The further apparatus embodiment 60 of FIG. 3 includes a furnace 100' for producing polycrystals of about 1½ inches in diameter and up to about 2 inches in length, and is of substantially similar construction to the apparatus 50 of FIG. 2, the same components thereof as apparatus 50 being denoted by the same reference numerals in those instances where plural or similar components are used they are designated with a numeral-prime designation. The major differences in apparatus 60 will be described now. Within the furnace 100' of the FIG. 3 apparatus in addition to the upper heating element 116' which is associated with the upper compartment 12' of crucible 10' is, a lower heating element 160 associated with the crucible lower compartment 14' and attached to upward extensions 162a of terminals 162 (FIG. 5). The upper heating element 116' in turn is being supported on upward extensions 164a of terminals 164 arranged at 90° disposition to terminals 162. As shown in FIG. 5, independent controls A and B can vary the power values of heaters 160 and 116', respectively. Separate support rods 170 and 172 are shown in FIG. 5, which are provided to support the graphite and molybdenum baffle structures of the upper and lower heater regions. The apparatus 60 embodiment of FIG. 3 is somewhat more flexible than the apparatus 50 of FIG. 2, and allows the establishment of the best conditions for polynucleation and polycrystallization of many different materials.

The following examples provide further description of specific materials and methods which can be employed for polycrystallization in accordance with the present invention.

EXAMPLE 1

In using the apparatus of FIG. 2 for polycrystallizing barium fluoride with lanthanum fluoride as an additive, passage 28 of crucible 10 was plugged with a piece 26 of single crystal barium fluoride. Approximately 300 grams of pure coarsely ground barium fluoride was well mixed with approximately 2% lanthanum fluoride by weight and approximately 1.5% by weight of lead fluoride. The barium fluoride starting material was pre-sintered to increase its density, since the usually available raw stock is a light powder which takes up too large a volume for efficient use. The presintering of the barium fluoride was done in a separate large furnace, under good vacuum conditions and with 1.5% by weight approximately of lead fluoride well mixed with the powder prior to the sintering process. Sintering temperature was about 1200° C. In the initial sintering, and in the final polycrystallizing process, the lead fluoride acts as a chemical scavenger for oxides and hydroxides that are usually formed when fluorides are heated in the presence of water and oxygen. The lead fluoride to some extent prevents the chemical reaction of water with fluoride salts, and to some extent reconverts the hydroxides formed by the water reaction with fluorides back to the fluoride salt. The by-products of lead, lead oxide, and lead hydroxide were expelled from the immediate environment of the fluoride materials and their container. The batch of 300 grams of pre-sintered barium fluoride, well mixed with 2% lanthanum fluoride and 1.5% lead fluoride, was placed in the upper compartment 12 of crucible 10, the lid 16 put into place, and the crucible 10 was then placed into the furnace 100, being positioned therein as shown in FIG. 2. The enclosure wall of furnace 100 was then lowered into contact with the base plate 104, with the O-ring therein making a sealing contact. The apparatus was then evacuated by vacuum fore pump and diffusion pump to a pressure of about $1 \times 10^{-6}$ Torr.

FIG. 9 shows the furnace input wattage versus time cycle of the polycrystallizing procedure. Electrical power in the furnace was supplied by a low secondary winding voltage of a power transformer. Input voltage of the transformer was regulated to prevent excessive voltage fluctuations, and the secondary voltage, applied to the furnace terminals, could be continuously varied by a motor driven variable transformer in the power transformer primary circuit. The power into the furnace was slowly raised to the point 1 on the line 200 of FIG. 9. During this power increase the temperature of the barium fluoride-lanthanum fluoride material gradually approached its melting point of about 1340° C. and shortly after reaching the time of the cycle indicated by point 1, the material started to melt from the top of the batch downwards. The initial slow heating to point 1 in the cycle was necessary to reduce chemical reaction of the fluorides with residual water in the starting material, and also to prevent any sudden expansions of the material by the release of gases contained therein. The initial positioning of the upper and lower compartment of crucible 10, as shown in FIG. 2, was such that at the time that point 2 was approached on line 200 of FIG. 9, the entire batch was molten and the plug 26 started melting with the lower compartment 14 of crucible 10 having reached the polynucleation temperature necessary for polycrystallization. The temperature in the lower compartment 14 of crucible 10 was in the polynucleation range of about 850° C. to 900° C. and was maintained by a substantially vertical heat flow downwards only from the upper center of the furnace and out through the bottom of crucible 10. Near point 2 on line 200 of FIG. 9 the barium fluoride plug melted away and the molten fluoride from the upper compartment proceeded to flow through passage 28 to the polynucleation compartment 14, the passage 28 being about 0.128 inches in diameter and one inch in length. In compartment 14 the fluoride commenced to polycrystallize on surface 41, and gradually built up a solid polycrystalline body of lanthanum fluoride doped barium fluoride weighing about 311 grams. Following the completion of the polycrystallization, at a time in the cycle near point 2 on line 200 of FIG. 9, the power was driven slowly downwards to zero. This was done to prevent breakage of the polycrystal from thermal contraction, and to avoid strains which might have caused it to break during annealing. To remove strains, which would cause breakage during cutting and polishing operations, the crystal was removed from the lower compartment of crubicle 10 after cooling, placed in the upper compartment of crucible 10, the furnace was pumped to a good vacuum, the annealing cycle of line 202 in FIG. 10 was performed, and the polycrystal was removed from the furnace ready for cutting and polishing. Slices 1½ inches in diameter and of various thicknesses were cut from the body and ground and polished for various studies of the optical quality of this material.

Figure 13:
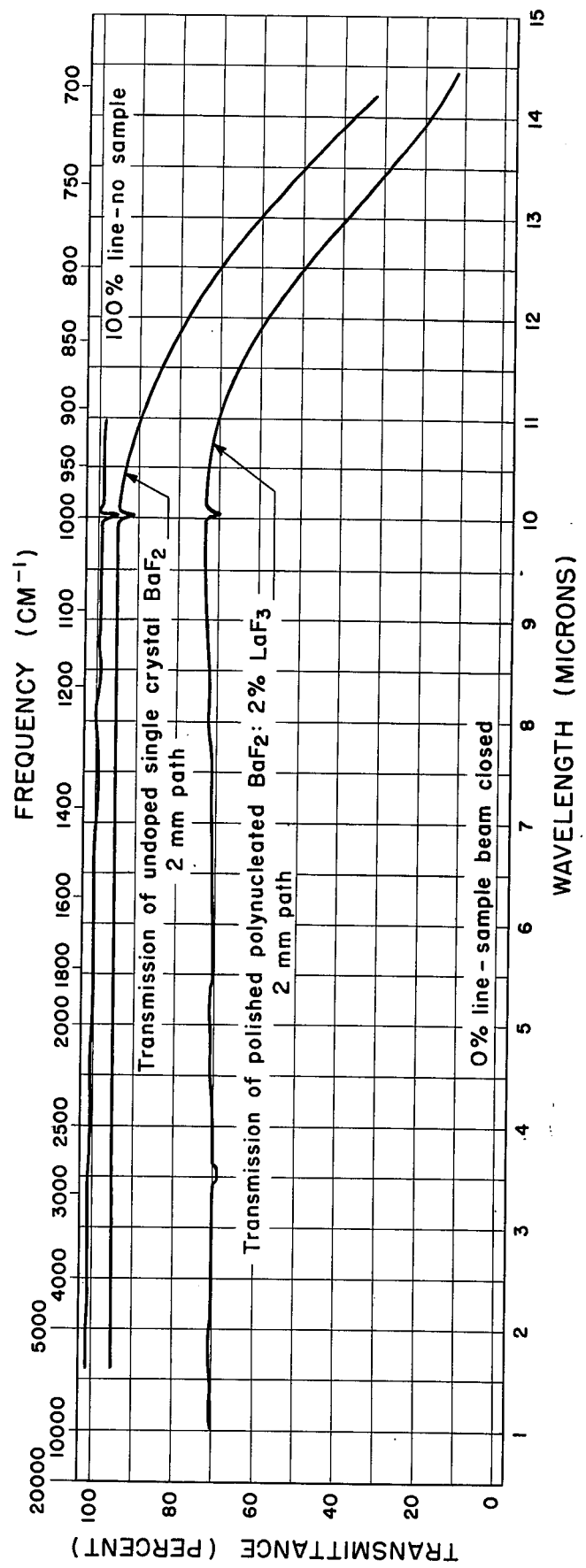
FIG. 13 is a graph showing optical transmittance in the infrared region, 1 micrometer to about 15 micrometers, of transparent polycrystalline barium fluoride doped with 2% lanthanum fluoride compared with the transmittance of undoped single crystal barium fluoride.

The barium fluoride with 2% lanthanum fluoride ($BaF_2 : 2\% LaF_3$) polycrystal is of particular interest for its useful infrared transmission characteristics. FIG. 13 shows the infrared optical transmission of a 1½ inch diameter, 2mm thickness polished window of the polycrystal produced as described above, and compares it with the transmission of a single crystal undoped barium fluoride polished window of the same thickness. The lower transmission of the $BaF_2 : 2\% LaF_3$ window relative to that of the single crystal $BaF_2$ shown in FIG. 13 is partly caused by higher reflection losses, which relate to the higher index obtained when $LaF_3$ was added to $BaF_2$, while it is thought some of the reduced transmission of the new material results from certain non-optimum production conditions, the elimination of which are achieved when using the apparatus of FIG. 3.

Examination of the $BaF_2 : 2\% LaF_3$ polished plates by transmitted polarized visible light, shows the very distinctive featherlike polycrystal grain growths ranging from about 0.1 to 1 mm in size, as shown in FIG. 18. In non-polarized visible light the 2 mm thick polished $BaF_2 : 2\% LaF_3$ window shows no sign of polycrystallinity and is colorless and transparent, but with a slight distortion in the view of distant objects probably caused by the somewhat variable index of the material.

EXAMPLE 2

The growing procedure and apparatus used in Example 1 were substantially repeated for Example 2, except that 150 grams of calcium fluoride were mixed thoroughly with 150 grams of yttrium fluoride and 2% by weight of lead fluoride. The calcium fluoride used was a coarsely powdered single crystal material of good quality, and the yttrium fluoride was a high quality and purity chemical powder. The mixed components ($CaF_2 : 50\% YF_3$) were placed in the upper compartment of crucible 10, as previously done in Example 1, with the plug 26 being a piece of single crystal calcium fluoride. A cycle similar to that of FIG. 9 was performed with the temperature in the upper plateau part of the cycle being about 1400° C. Passage 28, and all other conditions of the apparatus were as used in Example 1, and as shown in FIG. 2. With the higher power required to reach the 1400° C. top temperature, the temperature of the polycrystallization compartment 14 reached between 900° C. to 1000° C. Annealing was carried out with the top soaking powder input being about 800 Watts.

Figure 14:
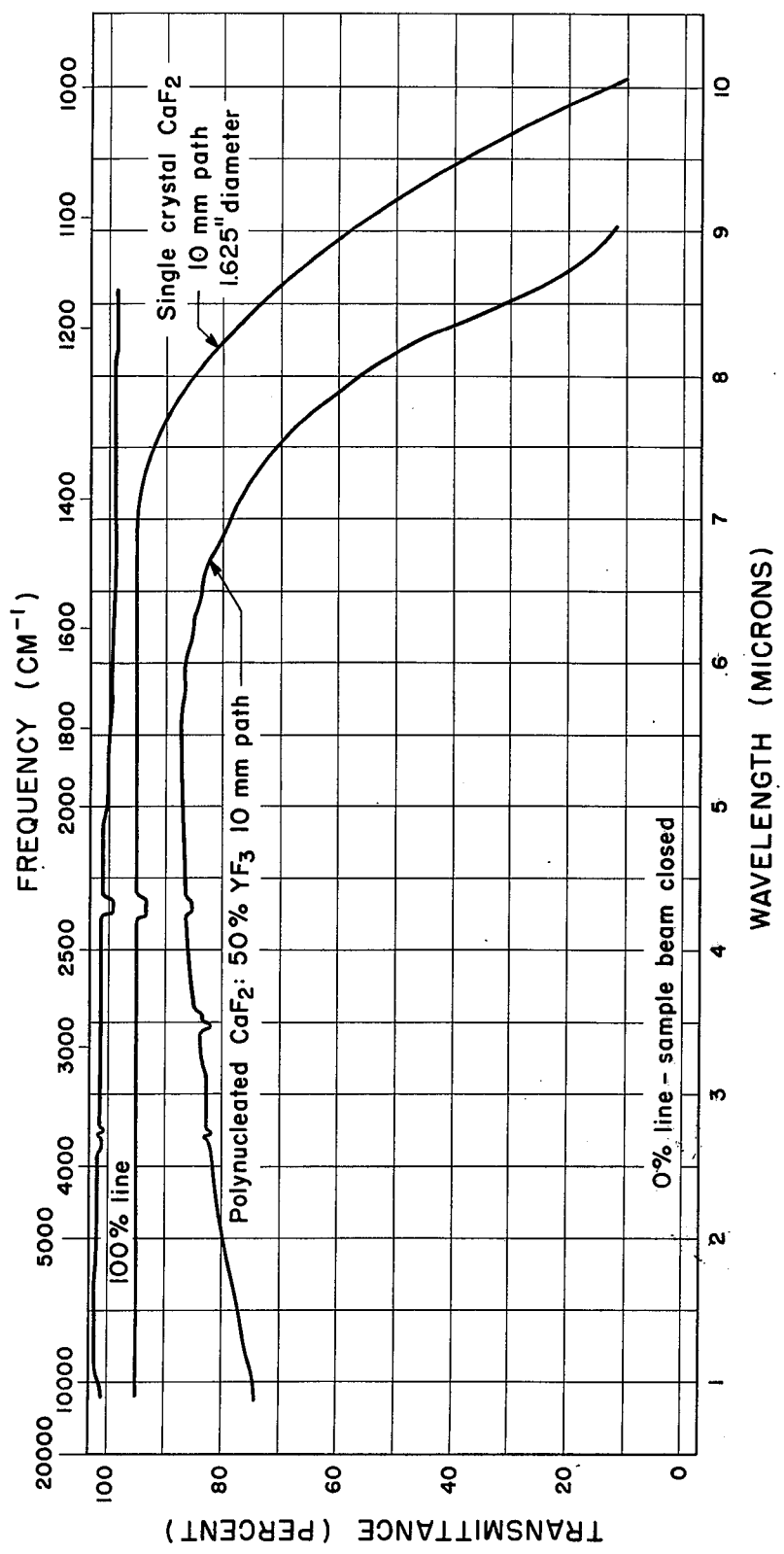
FIG. 14 is a graph showing optical transmittance in the infrared region, 1 micrometer to about 10 micrometers, of transparent calcium fluoride doped with 50% yttrium fluoride compared with the transmittance of undoped single crystal calcium fluoride.

A slice 10 mm thick was cut from the polycrystal of $CaF_2$ : 50% $YF_3$, produced as described above, and was ground and optically polished. A photomicrograph in plane polarized visible light of the transmission through this polished window is shown in FIG. 17 showing a characteristic featherlike grain growth. In visible unpolarized light the material is colorless and transparent and again shows some distortion for distant objects like the $BaF_2$ : 2% $LaF_3$ polycrystal described in Example 1. An infrared optical transmission curve of the $CaF_2$ : 50% $YF_3$ polycrystal window is shown in FIG. 14, and is compared in FIG. 14 with the transmission of a single crystal $CaF_2$ window of the same thickness.

EXAMPLE 3

Procedure for producing polycrystalline barium fluoride without a nucleating and grain growth regulating additive was developed, using a furnace of the type shown in FIG. 2. In place of the two compartment crucible of FIG. 1, a single compartment graphite crucible about 1¼ inches in inside diameter, and otherwise scaled in proportions to the lower compartment of FIG. 1 was used. The lid on this crucible was similar to the lid 16 of FIG. 1 in similarly scaled down proportions. Three hundred and fifty grams of coarsely crushed pre-sintered barium fluoride were mixed well with five (5) grams of lead fluoride. This mixture was poured into the 1¼ inch diameter crucible, and the crucible positioned in the furnace with its lid 16 in closure position. The crucible support structure was the same as that of FIG. 2, and the bottom surface of part 44 leveled to the bottom surface of part 122 in FIG. 2. After evacuation of the sealed furnace to a pressure of about $1 \times 10^{-6}$ Torr, the material temperature was raised according to that determined by the power versus time cycle of FIG. 9 as far as point 1 on line 200. After two hours time to allow for completion of melting, the crucible and contents were lowered 7/16 inches by lowering support rod 112 in FIG. 2. At this point the power was quickly dropped from 1800 watts to the polynucleation power of 900 watts resulting in a polynucleation temperature of about 900° C. Power was left at the polynucleation level for about six hours and the crucible was then raised back up to its original melting position and the polycrystal annealed according to the power versus time cycle of FIG. 10.

Figure 11:
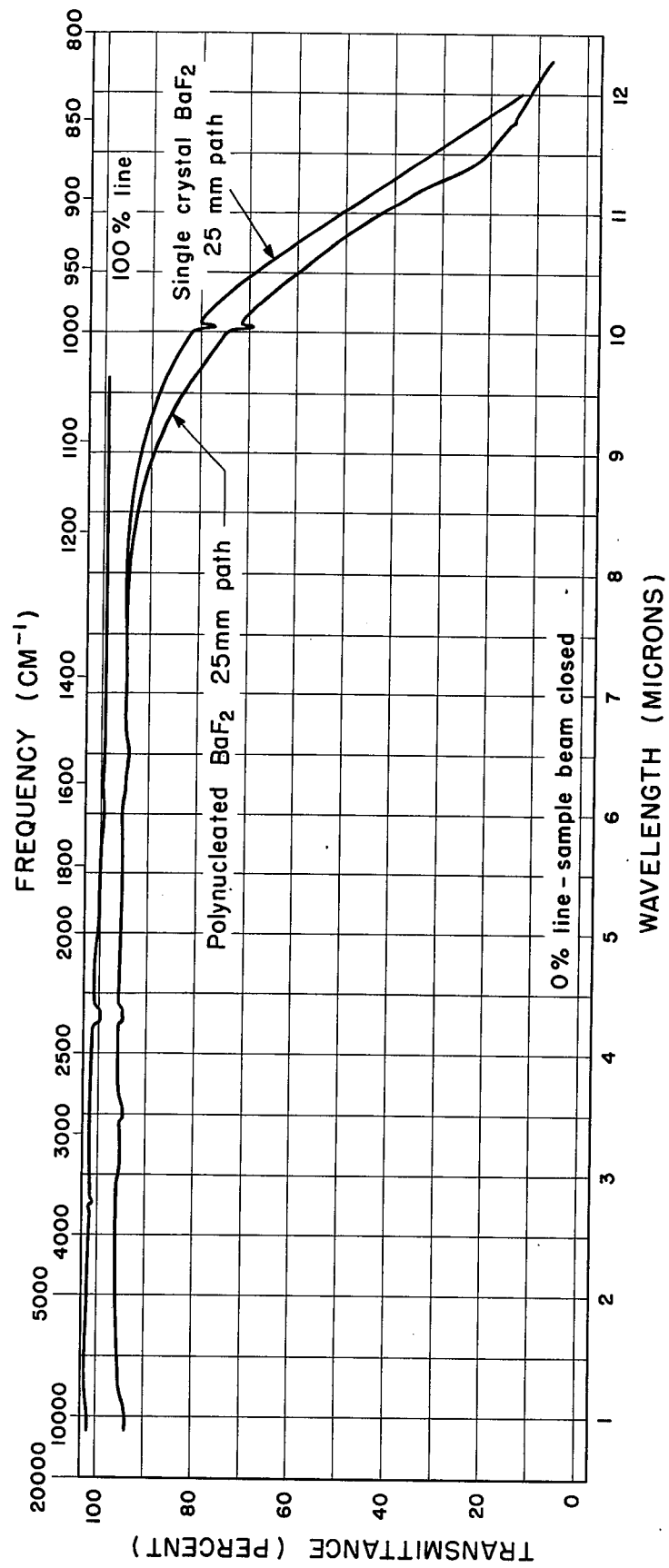
FIG. 11 is a graph showing optical transmittance in the infrared, 1 micrometer to about 12 micrometers region of transparent polycrystalline barium fluoride compared with the transmittance of single crystal barium fluoride.

After the above crystal was cooled to room temperature it was removed from the furnace and a 28 mm diameter by 25 mm long piece of it was fabricated with the end surfaces being ground and polished. Examination by visible light showed no sign of polycrystallinity, but through crossed polaroids the polycrystals having grain growths of about 2 to 3 mm in dimension were evident as a result of small differences in strain between neighboring crystallites. FIG. 16 shows this grain structure as a reflection microphotograph, with a magnification of 32X. Examination of the polished polycrystal with a strong highly focused light beam showed no signs of flaws or inclusions of the grain structure. The piece was colorless and completely transparent in visible light, and even distant objects were clear and distinct when observed through the length of the piece, through the polished ends. FIG. 11 shows that the infrared transmission of the above polycrystal through the polished ends is almost identical to the transmission of single crystal barium fluoride.

As has been noted above, the barium fluoride polycrystal described as Example 3 has grain growths of about 2 to 3 mm in dimension. This is a rather significant difference in the material produced by the present invention as compared to the product obtained by the powder pressing of barium fluoride. Powder pressing characteristically involves much smaller grain sizes as the starting material, and smaller grain sizes in the finished product. The reasons for this involve the physical processes in powder pressing, which favor the use of finely powdered starting materials, but also in the fact that fine grain structures have high strength properties. Where the ultimate in physical strength properties is required, the polycrystalline barium fluoride produced in Example 3 may not be the material to be used because of its grain size, and the present invention shows that smaller featherlike grain structures are accomplished by the use of additives as in Example 1 and Example 2. The product provided in Example 3 is a high optical quality barium fluoride polycrystalline optical material, capable of being produced economically in large sizes and with far superior mechanical strength properties to single crystal barium fluoride. Also because of its production by uniform nucleation from the melt, it is composed of grain boundaries intimately in contact, and with much less optical discontinuities in the grain boundaries that are present inherently in powder pressed materials.

EXAMPLE 4

Polycrystalline calcium fluoride was produced using the apparatus and method described in Example 3. Three hundred grams of high quality coarsely crushed natural fluorite mineral were well mixed with 6 grams of lead fluoride. Procedure of processing this material in the apparatus described in Example 3 were identical to that used in Example 3, except that the melting power was raised to 2000 watts, points 1 and 2 on line 200 of FIG. 9 being thereby moved about one hour longer out in the cycle, but otherwise the cycle of FIG. 9 still showing the polycrystallizing procedure. Annealing was identical to that described in Example 3.

Figure 12:
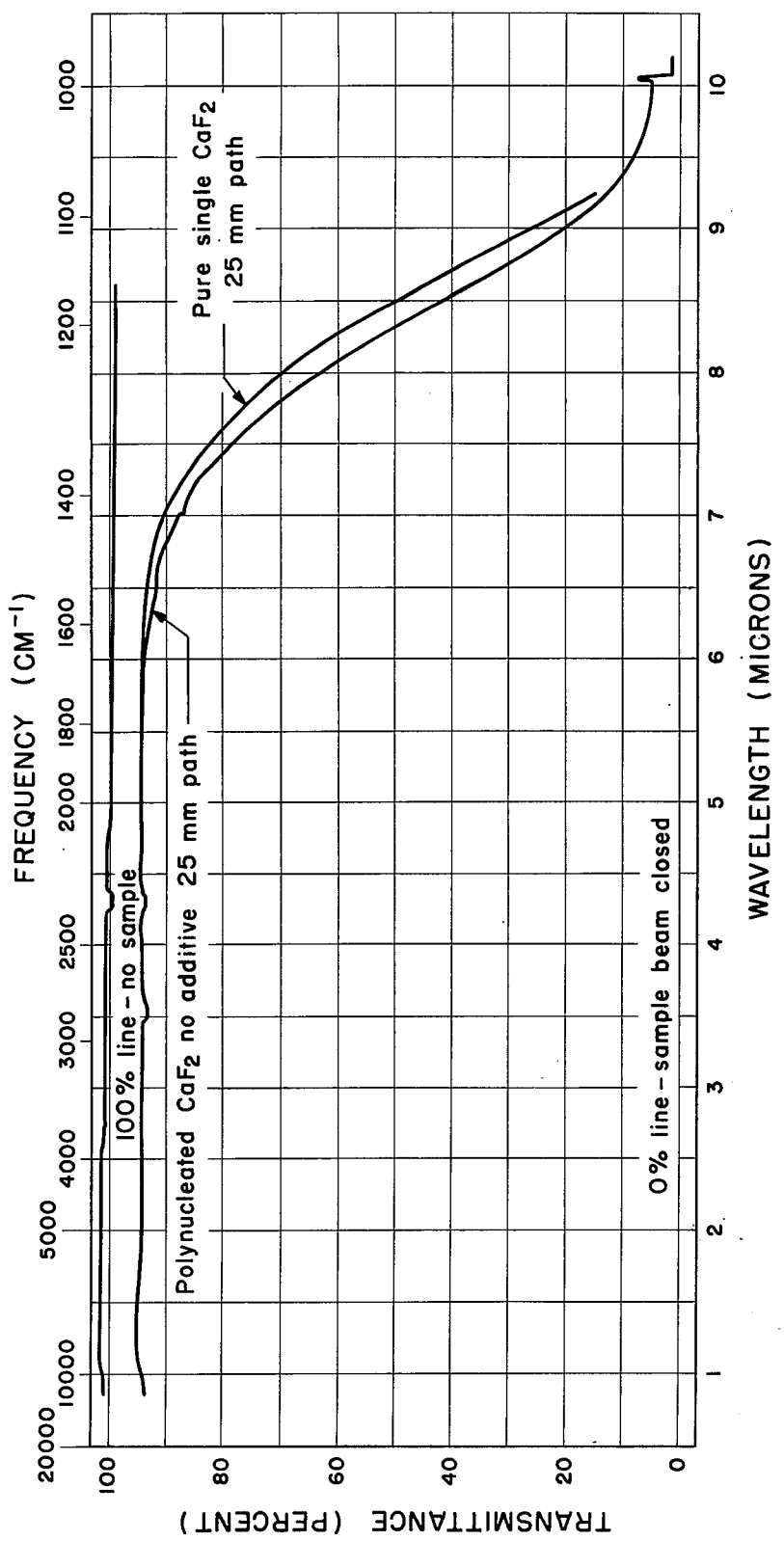
FIG. 12 is a graph showing optical transmittance in the infrared region, 1 micrometer to about 11 micrometers, of transparent polycrystalline calcium fluoride compared with the transmittance of single crystal calcium fluoride.

A 28 mm diameter by 25 mm length cylinder was cut from the polycrystal produced as described above and the ends ground and polished. Examination of this body by visible light through the polished surfaces showed excellent colorless transparent optical quality with no sign of grain structure and no visible light scattering or inclusions. Distant objects viewed through the 25 mm path were sharp and distinct, again indicating the optical continuity of the grains and their associated grain boundaries. FIG. 15 is a reflection photomicrograph at a power of 32X of one of the end surfaces taken after grinding but before polishing. Grain growths of about 3 to 5 mm in dimension can be seen in this photomicrograph. Decreases in this grain growth size could be achieved by improvements in production control obtained with the apparatus of FIG. 3, such grain sizes, e.g., of a calcium fluoride polycrystalline body is one of the distinguishing characteristics of the same as compared to polycrystalline calcium fluoride produced by powder pressing. Like the polycrystalline nucleated barium fluoride material described in Example 3, the material of Example 4 is an excellent optical quality calcium fluoride polycrystal capable of being produced economically in large sizes, and with far superior mechanical properties to single crystal calcium fluoride. FIG. 12 shows that the infrared transmission through polished ends of the polycrystal produced as described in Example 4 is almost identical to the transmission of single crystal calcium fluoride.

Figure 7:
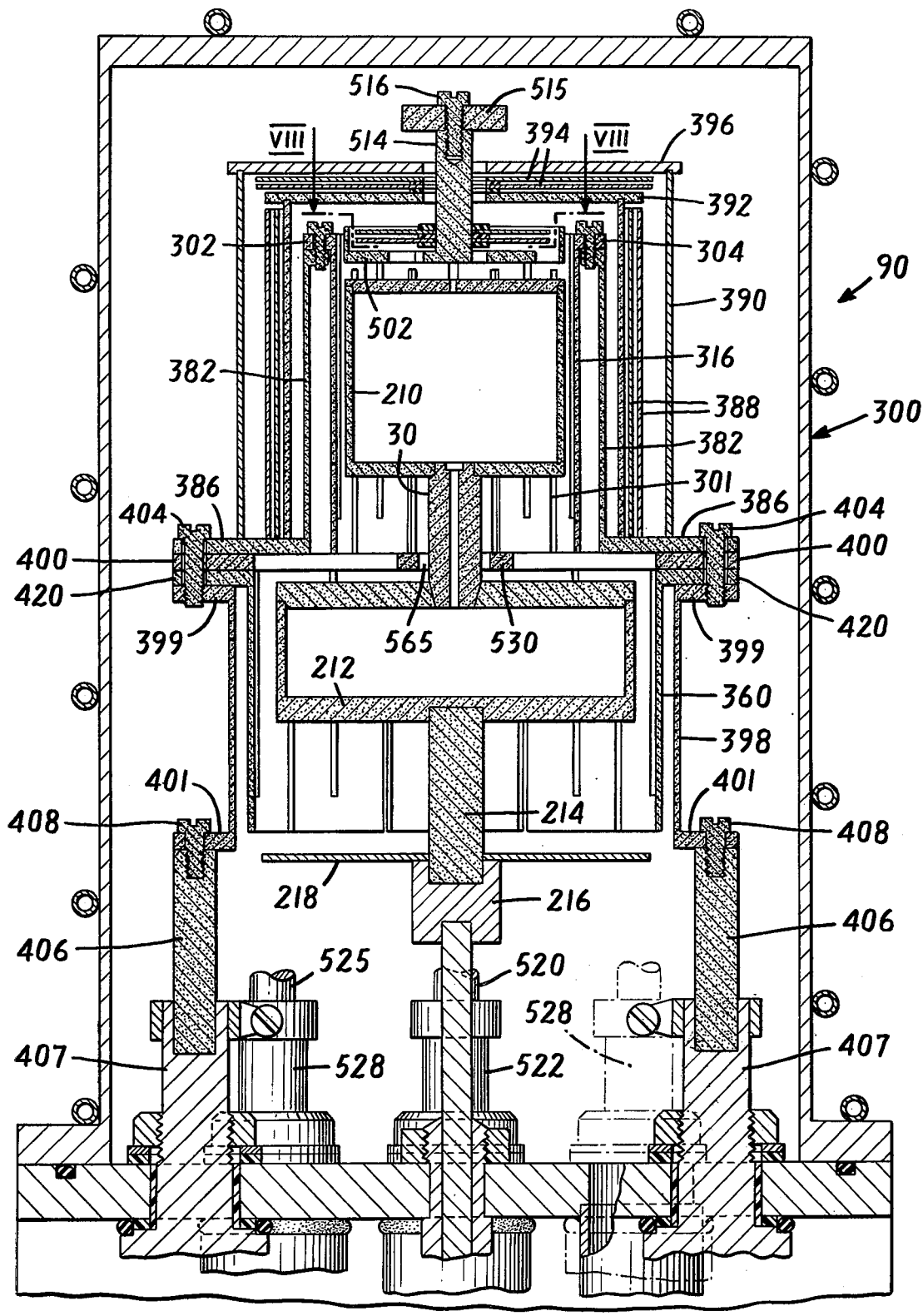
FIG. 7 is an elevational view partly in section depicting a baffled furnace for polycrystallizing material in ingots in the range up to 12 inches and more in diameter and containing therein an elongated crucible having two compartments with a passage interconnecting the compartments.

The apparatus 90 depicted in FIG. 7 is employed for producing large polycrystalline material up to 12 inches in diameter or more. Such apparatus has been designed especially for use in producing large polycrystals of some of the high melting point fluoride materials, such as polycrystal barium fluoride, with or without additives. Modifications in the apparatus 90 will occur to those skilled in the art when much lower melting and polycrystallizing temperatures are used in polycrystallizing other materials.

The apparatus 90 includes a furnace 300 wherein are disposed upper and lower graphite heater elements 316 and 360, respectively. The upper heater 316, for melting the material to be polycrystallized, can have an inside diameter, e.g., of 9 inches, a vertical height of 12 inches, and a thickness of 0.090 inches. The resistance of this heater 316 is determined by the number and size of the slots 301 cut through the wall of the graphite during fabrication, somewhat similar to those depicted at 120 on the heater shown in FIG. 6, but with four connector lugs 302-305 (FIG. 8) at the top of the heater, each 90° to the other, instead of the two lugs at the bottom and 180° apart as in FIG. 6. The heater 316 then has one set of lugs, 180° apart from each other, which form a common electrical terminal, and another set of lugs, 180° apart but 90° to the first set, which form the other common electrical terminal of the heater. Effectively the heater has four parallel resistance paths, e.g., 1.77 inches wide, 50 inches long, and 0.090 inches thick, which result in a total effective resistance to the upper heater of 0.032 ohms. With a 60 cycle, single phase electrical input of 30 volts, supplied from the secondary voltage of power transformers, the power drawn by the top heater 316 would be approximately 30 kilowatts. As shown in FIG. 7 the two diametrically opposite heater lugs 302, 304, at the top of heater 316, are bolted with $\frac{1}{2}$-13 graphite bolts to their common electrical feed cylinder 382. This graphite electrical feed cylinder 382 is approximately $11\frac{1}{2}$ inches long and 0.090 inches thick, and is terminated at its lower end by a $\frac{1}{2}$ inch thick annular flange 386 integrally machined to the cylinder 382. The annulus 386 supports the graphite electrical feed cylinder 382, the heater 316, two 0.010 inches thick molybdenum cylindrical radiation baffles 388, the 0.030 inches thick inconel cylinder baffle 390, the 3/16 inches thick graphite disc 392, the two 0.010 inches thick molybdenum radiation disc baffles 394, and the 3/16 inches thick stainless steel disc baffle 396. Annulus 386 is in turn supported by graphite cylinder 398, which is $9\frac{1}{2}$ inches long and 0.090 inches in wall thickness, and with $\frac{1}{2}$ inch thick annular flanges on each end. The upper flange 399 of cylinder 398 is bolted by means of two $\frac{3}{4}$-10 graphite bolts 404 to flange 386, with a $2\frac{1}{2}$ inch diameter by $\frac{1}{2}$ inch thick graphite spacer 400 received therebetween, and to the two 180° apart common lugs of the bottom graphite heater lugs 420. The lower flange 401 of cylinder 398 is supported by two $1\frac{3}{4}$ inch diameter graphite electrical feed rods 406, with a mechanical fastening provided by two $\frac{3}{4}$-10 graphite bolts 408. The electrical feed rods 406 are in turn fastened to and supported by water cooled copper electrodes 407. These water cooled electrodes are insulated from the furnace and are of a similar design to those shown in FIG. 2, but larger in size by a factor of about three times to accommodate the requirements of the larger furnace design.

Figure 8:
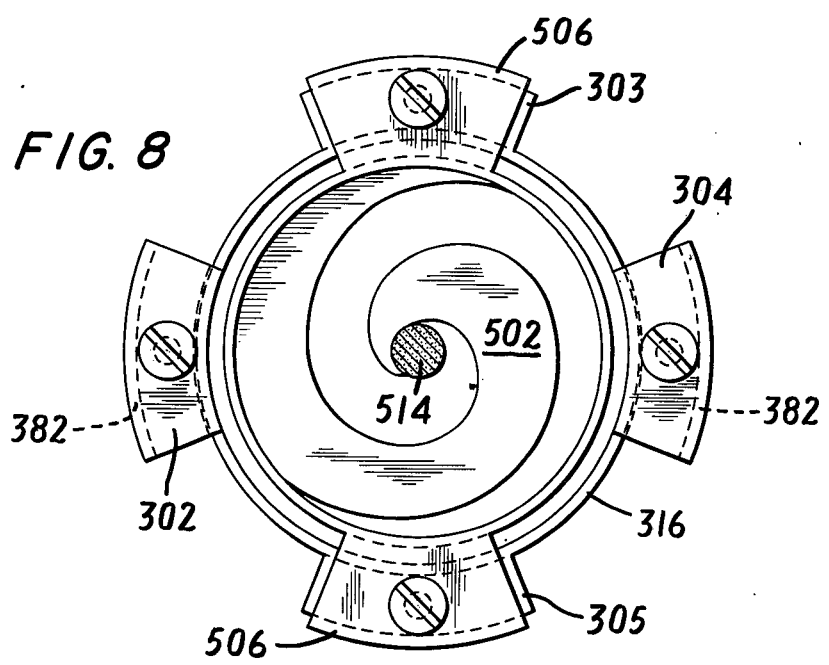
FIG. 8 is a top plan view of the upper heating element and side heating elements shown in FIG. 7 depicting the upper helical heating grid and electrical contacts for the upper hollow substantially cylindrical side heating component.

The upper structure of the Furnace of FIG. 7 has been considerably modified from that of the furnace of FIG. 3, because of the need to supply a source of heat energy to the upper approximately 12 inch diameter end aperture of the furnace. Small diameter furnaces such as shown in FIG. 2 and FIG. 3 do not require such extra end heat sources, but the need rapidly increases as the end aperture exceeds two or three inches in diameter. The upper furnace graphite end heater is shown in FIG. 7 in elevation as part 502, and in FIG. 8 is plan view. The heating unit 502 is a double spiral which is formed by machining a slot through the recessed $\frac{3}{8}$ inch thick, $8\frac{1}{2}$ diameter end surface, which thereby forms two parallel spiral electrical resistance paths 1 inch wide, $\frac{3}{8}$ inches thick, and 30 inches long from the $1\frac{1}{2}$ inches diameter graphite center lead 514, shown in FIG. 7, to the two outer 180° apart lugs 506 of FIG. 8. The lugs 506 are bolted by means of $\frac{1}{2}$-13 graphite bolts to the tapped holes in the two heater lugs 303, 305 of heater 316, which lugs 303, 305 are 180° apart from each other and on a center line 90° to heater lugs 302, 304, already described.

Figure 7A:
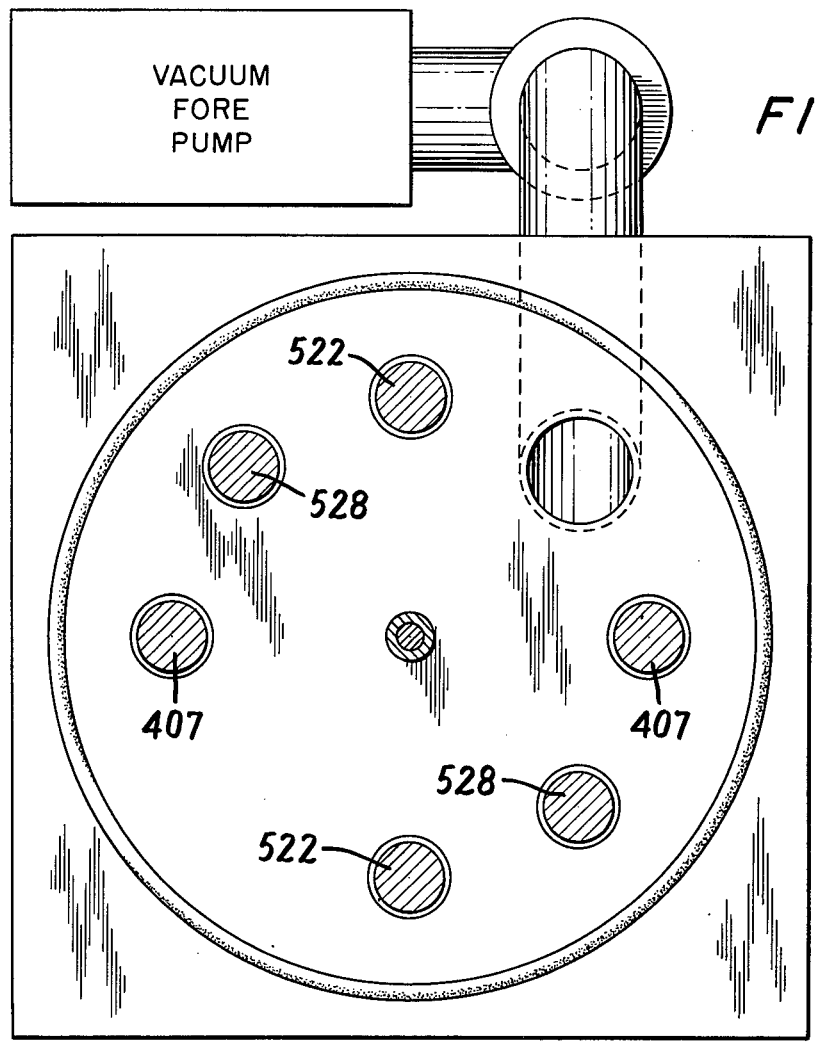
FIG. 7A is a plan view partly in section of the base structure associated with the furnace depicted in FIG. 7.

A continuous electrical circuit providing for the heating of the upper furnace is formed from the path starting with the two water cooled parallel electrodes 407, through the two parallel graphite feed electrodes 406, through the graphite cylinders 398 and 382, through the two common heater lugs 302, 304 and the four parallel paths of the heater 316, out from heater 316 to the two parallel lugs 303, 305 and into the end heater 502 double spiral path to the center lug 514. The center lug 514 bolts by means of a $\frac{3}{4}$-10 graphite bolt 516 to a graphite electrical feed strap 515 which is 4 inches wide, 1 inch thick and 20 inches long. The extremities of feed strap 515 are bolted with $\frac{1}{2}$-13 graphite bolts to two 180° apart $1\frac{3}{4}$ inch diameter graphite electrodes 520. These electrodes 520 connect to water cooled electrodes 522 insulated from the base plate and identical to the electrodes 407 mentioned previously. The center line of these electrodes 522, is at 90° to the center line of electrodes 407 with electrodes 528 disposed intermediate the last-mentioned electrode sets as shown in FIG. 7A. All of the water cooled electrodes of the FIG. 7 furnace are on an 18 inch diameter circle. The electrical circuit of the upper heaters of FIG. 7 is completed by placing the approximately 30 volt secondary windings of suitable power transformers across the water cooled electrodes 407 and 522.

The lower graphite heater 360 is somewhat similar to the upper heater 316, but has to achieve much lower temperatures, characterizing the polycrystallizing region, which it encloses. The lower heater 360 has an inside diameter of 14 inches, a length of $8\frac{3}{4}$ inches, and an element thickness of 0.125 inches. Like heater 316 it has four upper lugs, $\frac{1}{2}$ inch thick, all at 90° to each other. Each pair at 180° are common electrical contacts and one pair of these lugs 420 are bolted to cylinder 398, as described previously. By means of vertical slotting, the lower heater 360 has a band width of 2.75 inches, a thickness of 0.125 inches and comprises four parallel paths of effective length 30 inches. The heater will draw about 10 kilowatts at a voltage input of 10 volts. The parallel heater lugs of heater 360 which are at 90° to 5 lugs 420 are fed by a graphite feed strap 530, which is 4 inches wide, ½ inch thick, and 20 inches long, and which has a center hole 565, 3 inches in diameter through which is received crucible stem 30. The extremities of this strap 530 are connected by means of two ¾-10 graphite bolts to two vertical graphite electrical feed rods 525 which feed to two water cooled copper electrodes 528. The electrodes 528 are at 180° to each other and have a center line at an angle of 45° to the center line joining water cooled electrodes 407. Completing the electrical circuit of the lower heating region of FIG. 7 are electrical power transformers across the common electrodes 407 and the common electrodes 528.

The upper graphite melting crucible component 210 has an inside diameter of 8 inches and an outside diameter of 8½ inches, a length of 7½ inches, and a bottom thickness of ½ inch. The lower polycrystallizing graphite crucible component 212 has an inside diameter of 12½ inches and an outside diameter of 13 inches, an outside length of 5½ inches, and a bottom thickness of 1 inch. Support for the two crucibles is by means of 2 inch diameter graphite rod 214 and 3 inch diameter stainless steel support 216. Stainless steel disc baffle 218 optionally can be employed according to the conditions required for producing a particular polycrystal material.

The apparatus of FIG. 7 has been designed for vacuum operation and would be considerably modified where vacuum conditions were not desired or for other polycrystallizing conditions, as discused previously. To complete the apparatus the various other components of base unit, vacuum enclosure tank, adequate vacuum pumps, etc., are required. These would be essentially heavier capacity modifications of those used in the apparatus of FIG. 2.

What is claimed is:

1. A method for producing a polycrystalline material of high optical quality having a grain growth size in the range of about 0.10 to about 10.0 millimeters from a batch of crystalline metal halide material which comprises heating said batch sufficiently to convert said batch to a homogeneous noncrystallized molten mass thereafter cooling the mass to a temperature which is within the polynucleation temperature range of the mass, the polynucleation temperature range of a substance being defined as the temperature range below the melting point of the substance at which a rapid uniform removal of heat results in the formation of numerous nucleation or independent crystallization centers which form without substantial growth at the expense of other crystals, by removing heat in predetermined directions of outflow therefrom, at a removal rate which is substantially equal in each direction of outflow thereby to initiate freezing of said mass as a plurality of individual crystals each of which cohere with others of said crystals in random crystal orientation, and induce substantially uniform contraction of the frozen material in directions in correspondence to the directions of heat outflow, the heat removal being effected at a controlled rate to maintain sufficient of said batch of material molten to flow into any voids produced in the frozen portion by contraction of the same, and through said frozen portion at a rate which is at least substantially equal to the rate of liberation of latent heat of fusion and specific heat from the remaining molten material as the latter freezes, and continuing heat removal at said rate until said mass is completely frozen into a solid polycrystalline material.

2. The method of claim 1 wherein the batch of crystallizable material is melted in a first zone heated to a temperature sufficient to melt the batch to molten state, the molten batch thereafter being transferred at a predetermined rate in a constricted course through an orifice to a second zone maintained at substantially the polynucleation temperature of said material, the removal of heat from said mass being effected when it is in said second zone, the transfer of material from said first to second zones being at such predetermined rate to provide that said material when received in said second zone is sufficiently molten to flow into any voids produced in any frozen material already present in said second zone.

3. The method of claim 2 further comprising establishing a thermal barrier around the material in said second zone to confine removal of heat from said material to a substantially uni-direction flow therefrom.

4. The method of claim 1 wherein the heating and cooling of said crystallizable material is effected in a vacuum environment.

5. The method of claim 1 wherein the heating and cooling of said crystallizable material is effected in an pure gas environment.

6. The method of claim 1 wherein the crystallizable material comprises a metal of group IIA and a halide of group VIIA of the periodic table.

7. The method of claim 6 further comprising mixing a nucleation additive material with said batch of crystallizable material prior to melting of same.

8. The method of claim 7 wherein the crystallizable material comprises barium fluoride.

9. The method of claim 8 wherein the additive material is lanthanum fluoride.

10. The method of claim 7 wherein heat removal is effected at a rate such as to produce freezing of the material in individual crystals having grain growths in a range of about 0.01 to about 10 mm. cross dimension.

11. The method of claim 7 wherein the additive material comprises 0.1 to 50 percent by weight of the batch.

12. The method of claim 1 further comprising annealing said solid polycrystalline material by subjecting same to a controlled heating of predetermined magnitude for a predetermined period of time to relative residual stresses therein.

13. The method of claim 12 wherein the annealing is effected in a vacuum environment.

14. A method for producing a polycrystalline material of high optical quality having a grain growth size in the range of about 0.01 to about 10.0 millimeters from a batch of crystalline metal halide material which comprises heating said batch in a first zone sufficiently to convert said batch to a homogeneous noncrystallized molten mass, thereafter transferring said molten material at a predetermined rate and subjecting said mass in said second zone to cooling at substantially the polynucleation temperature thereof, the polynucleation temperature range of a substance being defined as the temperature range below the melting point of the substance at which a rapid uniform removal of heat results in the formation of numerous nucleation or independent crystallization centers which form without substantial growth at the expense of other crystals, by removing heat in a substantially unidirectional flow therefrom, thereby to initiate freezing of said mass as a plurality of individual crystals each of which cohere with other of said crystals in random crystal orientation, and induce contraction of the frozen material substantially in the direction of heat outflow only, and at a substantially uniform heat removal rate from the mass to maintain sufficient of said material molten to flow into any voids produced in the frozen portion by contraction of the same and through the frozen portion thereof which is at least substantially equal to the rate of liberation of latent heat of fusion and specific heat from the remaining molten material as the latter freezes, and continuing heat removal at said rate until said mass is completely frozen into a solid polycrystalline material.

15. A polycrystalline material consisting essentially of polynucleated barium fluoride with lanthanum fluoride as the nucleating agent present therein in localized concentrations wherein said material has optical transmission characteristics similar to single crystal barium fluoride in the range of about 0.5 to about 15 $\mu$m (micrometers), and is characterized by a solid mass of plurality of individual crystals each of which is cohered with others in a random orientation with the crystal grain growth size of said crystals on the average being in the range of about 0.10 to about 10 mm. and further characterized by a. the absence from the mass of dentritic voids and like spaces,
b. the absence of impurities in the crystal grain boundaries such that there is no appreciable light scattering and absorption by the polycrystalline material and
c. no appreciable variation in the crystalline material of optical transmission over the regions of the optical spectrum.

16. the polycrystalline material of claim 15 wherein said material includes from about 0.1 to about 50 percent of lanthanum fluoride.

17. The polycrystalline material of claim 15 wherein said material has an optical transmission curve showing transmission from about 0.500 to about 15 $\mu$m (micrometers) and polycrystalline grain growths of about 0.01 to about 2.00 millimeters in size.

* * * * *

UNITED STATES PATENT AND TRADEMARK OFFICE
CERTIFICATE OF CORRECTION

PATENT NO. : 4,038,201
DATED : July 26, 1977
INVENTOR(S) : Walter A. Hargreaves

It is certified that error appears in the above-identified patent and that said Letters Patent are hereby corrected as shown below:

At Col. 1, line 16, "are selected." should read --are selected for their transmission and optical scattering characteristics.--.

At Col. 2, line 31, "usual volume" should read --usual specific volume--

At Col. 2, lines 54-55, "special grain-growthy-controlling" should read --special grain-growth-controlling--.

At Col. 2, line 65, "materials calcium" should read --materials of calcium--.

At Col. 4, line 48, "additive and" should read --additive or--.

At Col. 7, line 63, "member of encircling wall 38" should read --member or encircling wall 38--.

At Col. 8, lines 64-65, "graphite support cylinder 188," should read --graphite support cylinder 118,--.

At Col. 10, line 26, "apparatus of FIG. 2," should read --apparatus 50 of FIG. 2,--.

UNITED STATES PATENT OFFICE
CERTIFICATE OF CORRECTION

PATENT NO. : 4,038,201
DATED : July 26, 1977
INVENTOR(S) : Walter A. Hargreaves

It is certified that error appears in the above-identified patent and that said Letters Patent are hereby corrected as shown below:

At Col. 17, line 45, (Claim 1), "crystalline metal" should read --crystalizable metal--.

At Col. 18, line 57, (Claim 12), "to relative" should read --to relieve--. Correct wording can be found in claim 14 as originally filed.

Signed and Sealed this

Sixth Day of February 1979

[SEAL]

Attest:

RUTH C. MASON
*Attesting Officer*

DONALD W. BANNER
*Commissioner of Patents and Trademarks*